United States Patent
Liu et al.

(10) Patent No.: US 10,256,805 B2
(45) Date of Patent: Apr. 9, 2019

(54) PROTECTIVE CIRCUIT WITH CURRENT REGULATING DIGITAL OUTPUT MODULE

(71) Applicant: ABB Schweiz AG, Baden (CH)

(72) Inventors: Wei Liu, Zhejiang (CN); Huan Shi, Zhejiang (CN); Axel Lohbeck, Zhejiang (CN)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 15/232,358

(22) Filed: Aug. 9, 2016

(65) Prior Publication Data

US 2016/0352213 A1 Dec. 1, 2016

Related U.S. Application Data

(63) Continuation of application No. PCT/CN2014/086282, filed on Sep. 11, 2014.

(51) Int. Cl.
  *G05F 1/573* (2006.01)
  *H03K 17/082* (2006.01)
  *H02H 9/02* (2006.01)

(52) U.S. Cl.
  CPC ......... *H03K 17/0826* (2013.01); *G05F 1/573* (2013.01); *H02H 9/02* (2013.01)

(58) Field of Classification Search
  CPC ........... G05F 1/573; G05F 1/575; H02H 9/02; H02H 9/025; H03K 17/0826
  See application file for complete search history.

(56) References Cited

U.S. PATENT DOCUMENTS 3,714,512 A * 1/1973 Grabowski ............. G05F 1/573
  323/277
4,271,450 A * 6/1981 Nishimura ........... H01H 47/226
  327/197

(Continued)

FOREIGN PATENT DOCUMENTS

CN 101656414 A 2/2010
CN 202309017 U 7/2012

(Continued)

OTHER PUBLICATIONS

State Intellectual Property Office of the P.R. China, International Search Report & Written Opinion issued in corresponding Application No. PCT/CN2014/086282, dated May 28, 2015, 10 pp.

(Continued)

*Primary Examiner* — Harry R Behm
(74) *Attorney, Agent, or Firm* — J. Bruce Schelkopf; Taft Stettinius & Hollister LLP

(57) ABSTRACT

Embodiments of the present disclosure provide a protective circuit to be used in a digital output module, the digital output module comprises a first voltage source and at least an output terminal. The protective circuit comprises: a first sampling unit for sampling a first voltage relevant to the output current from the first voltage source, a first comparing unit for comparing the sampled first voltage with a first reference voltage, a control unit for generating a current regulating signal based on a result from the first comparing unit, and a current regulating unit for regulating the output current from the first voltage source based on the current regulating signal. This protective circuit provides overflowing and short circuit protection, and is cheap in cost.

19 Claims, 2 Drawing Sheets

(56) References Cited

U.S. PATENT DOCUMENTS

| | | | | |
|---|---|---|---|---|
| 4,438,473 A * | 3/1984 | Cawley | ............... | G05F 1/569 |
| | | | | 361/101 |
| 5,764,041 A * | 6/1998 | Pulvirenti | ............ | G05F 1/573 |
| | | | | 323/273 |
| 6,125,024 A * | 9/2000 | LeComte | ............ | H02H 3/025 |
| | | | | 361/104 |
| 6,201,674 B1 * | 3/2001 | Warita | ............ | G05F 1/573 |
| | | | | 323/277 |
| 7,420,791 B1 * | 9/2008 | Dong | ............ | G01R 31/31721 |
| | | | | 361/90 |
| 2002/0057079 A1 * | 5/2002 | Horie | ............ | G05F 1/575 |
| | | | | 323/282 |
| 2003/0076638 A1 * | 4/2003 | Simonelli | ............ | G05F 1/571 |
| | | | | 361/56 |
| 2005/0151522 A1 | 7/2005 | Haraguchi et al. | | |
| 2005/0176472 A1 * | 8/2005 | Fitzpatrick | ............ | H04B 1/1607 |
| | | | | 455/572 |
| 2006/0158810 A1 * | 7/2006 | Tamosaitis | ............ | H02H 9/002 |
| | | | | 361/93.1 |
| 2006/0203400 A1 * | 9/2006 | Bodano | ............ | G05F 3/30 |
| | | | | 361/18 |
| 2007/0188958 A1 | 8/2007 | Sase et al. | | |
| 2007/0291434 A1 | 12/2007 | Sato | | |
| 2009/0225478 A1 * | 9/2009 | Kido | ............ | G05F 1/573 |
| | | | | 361/18 |
| 2011/0234290 A1 * | 9/2011 | Ramamurthy | ............ | G05F 1/561 |
| | | | | 327/332 |
| 2012/0236604 A1 | 9/2012 | Ger et al. | | |
| 2014/0218200 A1 * | 8/2014 | Chen | ............ | H02H 3/087 |
| | | | | 340/644 |

FOREIGN PATENT DOCUMENTS

| | | |
|---|---|---|
| CN | 102684507 A | 9/2012 |
| CN | 102931629 A | 2/2013 |
| CN | 203026929 U | 6/2013 |
| CN | 103296642 A | 9/2013 |
| CN | 203205843 U | 9/2013 |
| CN | 103414178 A | 11/2013 |
| CN | 103904628 A | 7/2014 |
| JP | 63023513 Y2 * | 6/1988 |
| JP | 2014154669 A | 8/2014 |

OTHER PUBLICATIONS

State Intellectual Property Office, First Office Action dated Feb. 23, 2018 in corresponding Chinese application No. 201480075237.4 (20 pages).

Extended European Search Report, European Patent Application No. 14901773.3, dated May 7, 2018, 8 pages.

* cited by examiner

PROTECTIVE CIRCUIT WITH CURRENT REGULATING DIGITAL OUTPUT MODULE

FIELD OF INVENTION

Embodiments of the present disclosure relate to the field of the protective circuit, and especially a current limiting and short circuit protective circuit in a digital output module.

BACKGROUND ART

An industrial control system is now used in almost every industrial area such as oil & gas, chemical, pharmaceutical, paper, mining and metal field. One of main purposes of the industrial control system is to control the field devices automatically and run the process fast, efficiently and precisely. Normally, the control system contains engineering stations, operation stations, controllers, I/O stations, terminal boards and field devices.

A digital output signal is widely used in process control for applications like ON/OFF control and relay output. A digital output module outputs high or low level based on the operation or control algorithm.

An advanced digital output module supports multiple output channels and diagnostic and protection functions. Short circuit detection is important diagnostic information which can used to inform the user if there is a cable short circuited in the field. Such short circuit detection is necessary for the digital output module because the short circuit may cause big current in the control loop which may damage the electronic elements in the module.

Standard short circuit detection and protection solution uses a smart high side switch (such as Infineon BTS4141N) to measure an internal temperature and realize current limitation and short circuit protection. However, this kind of switch is relatively expensive. For a digital output module with multiple output channels, using this type of switch for each channel would result in a rather high total cost for the module.

SUMMARY OF INVENTION

Hence, in order to overcome one or more of the deficiencies in the prior art mentioned above, one of objectives of embodiments of the present disclosure is to provide a protective circuit which is much cheaper compared to the smart high side switch as known.

According to one aspect of the embodiments of the present disclosure, there is provided a protective circuit to be used in a digital output module. The digital output module comprises a first voltage source and least an output terminal. The protective circuit comprises: a first sampling unit for sampling a first voltage relevant to the output current from the first voltage source, a first comparing unit for comparing the sampled value with a first reference voltage, a control unit for generating a current regulating signal based on a result from the first comparing unit, and a current regulating unit for regulating the output current from the first voltage source based on the current regulating signal. This protective circuit can provide an overflowing protection for an output device by regulating the output current of the voltage source in response to the feedback from the sampling unit.

According to an exemplary embodiment, the current regulating unit comprises: a first transistor having a base junction, an emitter junction and a collector junction. The first transistor is configured to be conductive under low level on the base junction which is lower than a cut-off voltage. The collector junction of the first transistor is configured to be connected to one of the at least an output terminal, the base junction of the first transistor is connected to the control unit, and the emitter junction of the first transistor is connected to the sampling unit.

According to an exemplary embodiment, the sampling unit comprises the second resistor; and the first comparing unit comprises a first voltage comparator, which inverting input connected to a first reference voltage, and which positive input connected between the second resistor and the emitter junction of the first transistor, and which output connected to the control unit.

According to an exemplary embodiment, the first voltage comparator is configured to output low level if the voltage on its positive input is lower than the first reference voltage, and output a high resistance substantially corresponding to an off state if the voltage on its positive input is higher than the first reference voltage.

According to an exemplary embodiment, the first reference voltage is set to the value of the voltage of the first voltage source minus the estimated voltage drop on the second resistor in the overflowing state of the output terminal.

According to an exemplary embodiment, the control unit comprises a second transistor having a base junction, an emitter junction and a collector junction. The second transistor is configured to be conductive under high level on the base junction which is higher than a cut-off voltage. The collector junction of the second transistor is connected to the base junction of the first transistor via a first resistor, the base junction of the second transistor is connected to the first comparing unit, and the emitter junction of the second transistor is connected to the grounding plane.

According to an exemplary embodiment, the control unit can further comprising a first capacitor connected between the base junction of the first transistor and the first voltage source.

According to an exemplary embodiment, the base junction of the second transistor is further connected to a second voltage source via a third resistor unit and to a control signal terminal of the digital output module via a first diode.

According to an exemplary embodiment, the protective circuit further comprises a second sampling unit for sampling a second voltage relevant to the output current from the first voltage source; a second comparing unit for comparing the sampled second voltage with a third reference voltage, and a signal processing unit for processing an output signal from the second comparing unit to generate a short-circuit control signal. The control unit is further configured to generate a current regulating signal based on the short-circuit control signal. By means of the above units, the protective circuit can provide short circuit protection.

According to an exemplary embodiment, the second comparing unit comprises a third voltage comparator. A positive input of the third voltage comparator is connected to the third reference voltage, and an inverting input of the third voltage comparator is connected to the output terminal so as to act as the second sampling unit, and an output of the third voltage comparator is connected to the signal processing unit.

According to an exemplary embodiment, the third voltage comparator is configured to output low level if the voltage on its inverting input is higher than the third reference voltage, and output a high resistance substantially corresponding to an off state if the voltage on its inverting input is lower than the third reference voltage.

According to an exemplary embodiment, the third reference voltage is set to the value of the voltage of the first voltage source minus the estimated voltage drop between the first voltage source and the output terminal in the short circuit state of the output terminal.

According to an exemplary embodiment, the signal processing unit comprises: a second voltage comparator. A positive input of the second voltage comparator is connected to a second reference voltage, and an inverting input of the second voltage comparator is connected to the control signal terminal via a second diode, and an output of the second voltage comparator is connected to the base junction of the second transistor via a third diode.

According to an exemplary embodiment, the signal processing unit can further comprise a third voltage source connected to the inverting input of the second voltage comparator via a fourth resistor unit.

According to an exemplary embodiment, the second voltage comparator is configured to output low level if the voltage on its inverting input is higher than the second reference voltage, and output a high resistance substantially corresponding to an off state if the voltage on its inverting input is lower than the second reference voltage.

According to an exemplary embodiment, the second reference voltage is set to be lower than the voltage on the third voltage source.

According to an exemplary embodiment, the signal processing unit further comprising a second capacitor connected between the inverting input of the second voltage comparator and the grounding plane, such that the signal processing unit can filter the instant large current noise so as to avoid the un-intended cut off action.

According to an exemplary embodiment, the signal processing unit further comprising a fourth voltage source connected to the output of the second voltage comparator via a fifth resistor. As such, the signal processing unit can provide an indication to the user or another automatic device whether a short circuit has occurred.

According to an exemplary embodiment, the first transistor is a PNP transistor or P-channel metal oxide semiconductor, and the second transistor is a NPN transistor or N-channel metal oxide semiconductor.

According to an exemplary embodiment, a digital output module having at least one output channel is also provided, wherein at least one output channel is connected to the protective circuit as mentioned above.

Since all the electronic elements in the protective circuit are common elements which are relatively cheap, the cost for each protective circuit is rather cheaper compared to the smart high side switch as known, such that it is acceptable in cost to provide one protective circuit for each channel of the digital output module.

BRIEF DESCRIPTION OF THE DRAWINGS

When reading the following detailed description on the exemplary embodiments with reference to the drawings, the aim, features and advantages of the present disclosure become obvious, wherein.

DETAILED DESCRIPTION OF EMBODIMENTS

Figure 1:
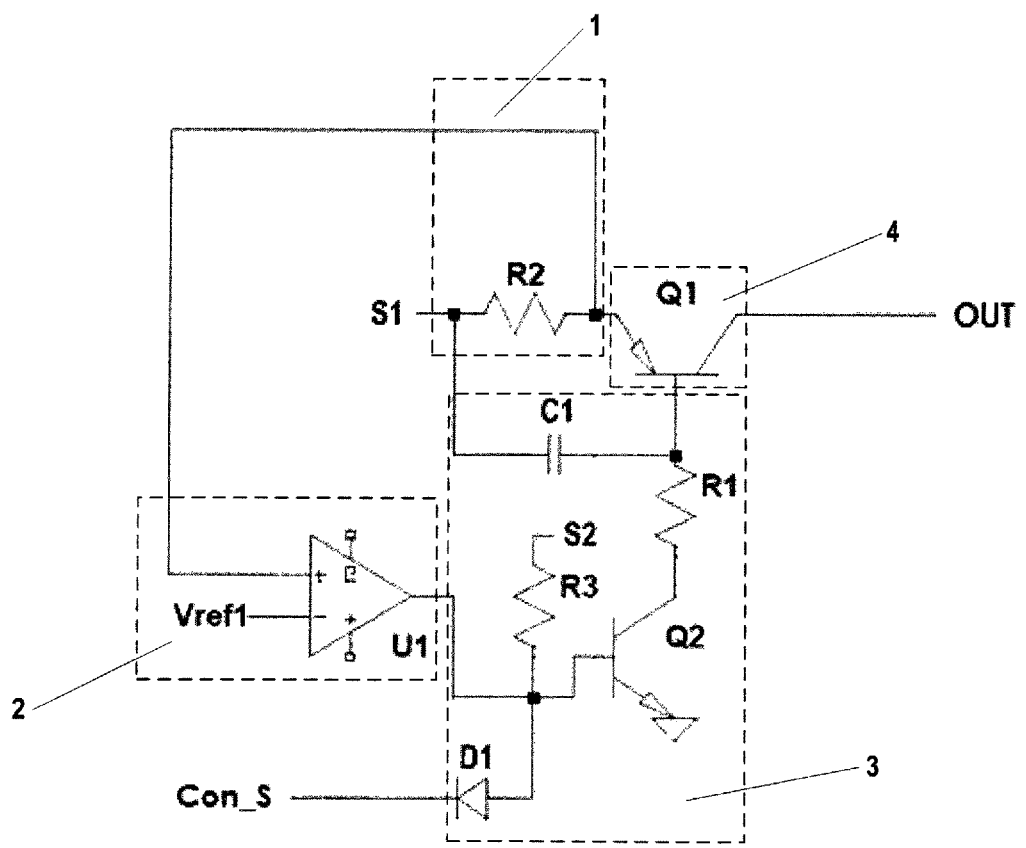
FIG. 1 illustrates a circuit diagram of the protective circuit according to an exemplary embodiment of the present disclosure.

Hereinafter, exemplary embodiments will be referred to in describing the mechanism and spirit of the present disclosure. It should be understood that these embodiments are merely provided to facilitate those skilled in the art in understanding and in turn implementing the present disclosure, but not for limiting the scope of the present disclosure in any way.

Various embodiments of the present disclosure are described in detail herein in an exemplary way by referring to the drawings.

FIG. 1 illustrates a circuit diagram of a digital output module with a protective circuit according to an exemplary embodiment of the present disclosure. The protective circuit can be connected to one output channel of a digital output module. The digital output module comprises a first voltage source S1 for providing power to the output terminal OUT of each channel. A load is connected to each output terminal OUT of the module to receive the digital output (high level) from the module. The load can be any electrical device used in the industry, such as a field device. The first voltage source S1 usually can provide a voltage of 24V as a standard voltage for a control module. The digital output module further comprises one control signal terminal Con_S for each channel to send a control command to each channel so as to control the first voltage source S1 to output a current (corresponding to a high level) from the output terminal OUT to the load.

According to one embodiment of the present disclosure, the protective circuit can comprise a first sampling unit 1 configured to sample a first voltage relevant to an output current from the first voltage source S1, a first comparing unit 2 configured to compare the sampled first voltage with a first reference voltage Vref1; a control unit 3 configured to generate current regulating signal based on a result from the first comparing unit 2, and a current regulating unit 4 configured to regulate the output current from the first voltage source S1 based on the current regulating signal.

The first sampling unit 1 samples the information about the output current of the output terminal, and the first comparing unit 2 evaluates the current output current. Based on the evaluation result, the control unit 3 can generate a current regulating signal to the current regulating unit 4. Thus, the current regulating unit 4 can regulate the output current within a predetermined value to avoid overflowing on the load.

Specifically, according to one embodiment, as shown in FIG. 1, the current regulating unit 4 can comprise a first transistor Q1 having a base junction, an emitter junction and a collector junction. The first transistor Q1 can be configured to be conductive under low level on the base junction which is lower than a cut-off voltage. The collector junction of the transistor Q1 can be connected to an output terminal OUT of the protective circuit, and the base junction of the first transistor Q1 is connected to the control unit 3, and the emitter junction of the first transistor Q1 is connected to the first voltage source S1 via a second resistor R2.

According to one embodiment, as shown in FIG. 1, the sampling unit 1 can comprise the second resistor R2; and the first comparing unit 2 can comprise a first voltage comparator U1. An inverting input of the first voltage comparator U1 is connected to the first reference voltage Vref1, and a positive input of the first voltage comparator U1 is connected between the second resistor R2 and the emitter junction of the first transistor Q1. An output of the first voltage comparator U1 is connected to the control unit 3.

Further, according to one embodiment, as shown in FIG. 1, the control unit 3 can comprise a second transistor Q2 having a base junction, an emitter junction and a collector junction. The second transistor Q2 can be configured to be conductive under high level on the base junction which is higher than a cut-off voltage. A collector junction of the second transistor Q2 is connected to the base junction of the first transistor Q1 via a first resistor R1. The base junction of the second transistor Q2 is connected to the output of the first comparing unit 2. For example, the base junction of the second transistor Q2 is connected to the output terminal of the first voltage comparator U. An emitter junction of the second transistor Q2 is connected to ground.

Further, according to one embodiment, as shown in FIG. 1, the control unit 3 further comprises a first capacitor C1 connected between the base junction of the first transistor Q1 and the first voltage source S1. The base junction of the second transistor Q2 is further connected to a second voltage source S2 via a third resistor R3 and to the control signal terminal Con_S via a first diode D1. The second voltage source S2 acts as a high level reference for the second transistor Q2.

As shown in FIG. 1, the first transistor Q1 can be implemented as a PNP transistor, and the second transistor Q2 can be implemented as a NPN transistor. It should be understood that the first transistor Q1 and the second transistor Q2 can also be implemented as any other kind of semi-conducive switching elements, as long as the first transistor Q1 can be switched to be conductive under a low level on its base junction (control end), while the second transistor Q2 can switched to be conductive under a high level on its base junction (control end). For example, the first transistor Q1 can also be a P-channel metal oxide semiconductor, and the second transistor Q2 can also be a N-channel metal oxide semiconductor.

According to one embodiment, the first voltage comparator U1 can be configured to output low level if the voltage on its positive input is lower than the first reference voltage Vref1, and output a high resistance substantially corresponding to an off state if the voltage on its positive input is higher than the first reference voltage Vref1. The first voltage comparator U1 can be implemented in any kind of electronic circuit or electronic component as known.

The first reference voltage Vref1 can be set to a value of the voltage of the first voltage source S1 minus the estimated voltage drop on the second resistor R2 in the overflowing state of the output terminal of the protective circuit. A user may define an estimated current value flowing through the output terminal of the protective circuit which indicates an overflowing state of the protective circuit. By multiplying the estimated current value by the resistance of the second resistor R2, the estimated voltage drop on the second resistor R2 can be obtained. In one embodiment, the estimated voltage drop on the second resistor R2 is set to 2.8V. In this case, the first reference voltage would be set to the voltage of the first voltage source S1 24V minus 2.8V, i.e. 21.2V.

In operation, the protective circuit can be connected in one digital output channel of a digital output module. The output terminal OUT of the protective circuit can act as the output of the module and provide a digital signal to the load so as to control the operation of the load. In one embodiment, the control signal terminal Con_S can be connected to a signal generator, such as a MCU, to receive a control signal for controlling the output of the module.

According to one embodiment, in normal operating condition, if the digital output module is not intended to output a high level, a signal generator would send low level from the control signal terminal Con_S such that the voltage on the positive end of the first diode D1 is higher than the inverting end due to the second voltage source S2. Thus, the diode D1 is conductive. As a result, nearly the total voltage of the second voltage source S2 is dropped on the third resistor R3, and the level on the base junction of the second transistor Q2 remains around zero, which is lower than the cut-off voltage of the second transistor Q2. Since the second transistor Q2 would not be conductive when the voltage on the base junction is lower than the cut-off voltage, there is no current passing through the second resistor R2, the first transistor Q1, the first resistor R1 and the second transistor Q2. As a result, the voltage on the base junction of the first transistor Q1 keeps the same as on the emitter junction of the first transistor Q1. Since the first transistor Q1 is not conductive when the voltage on the base junction is not lower than the voltage on the emitter junction, there is no current flowing through the output terminal OUT to the external load. Meanwhile, since the voltage on the emitter junction of the first transistor Q1 is the same as the first voltage source S1, the voltage on the positive input of the first voltage comparator U1 would be higher than first reference voltage. As a result, the first voltage comparator U1 would output a high resistance which may be considered as an off state on the output, such that the output of the first voltage comparator U1 would not impact the voltage on the base junction of the second transistor Q2.

According to further embodiments, if a control signal with high level (for example, a relatively high level no lower than the voltage of the second voltage source S2) is sent to the control signal terminal Con_S by a signal generator, the first diode D1 would be no longer conductive since the voltage on the inverting end of the diode D1 is no longer lower than the positive end. As a result, there is no voltage drop on the third resistor R3, and the voltage on the base junction of the second transistor Q2 would remain in the voltage of the second voltage source S2, for example 5V in this embodiment. The voltage of the second voltage source S2 on the base junction of Q2 is higher than the cut-off voltage of the second transistor Q2 which is normally 0.7V, for example. Therefore, the second transistor Q2 (such as a NPN transistor) is switched to be conductive, and thus the base junction of the first transistor Q1 will be grounded through the first resistor R1 and the first transistor Q1 will then be conductive, and thus a current flows from the first voltage source S1 through the emitter junction and the collector junction of the first transistor Q1 to the output terminal OUT. As such, the external load connected to the output terminal OUT can receive this current or voltage signal as a high level digital signal for controlling the load, for example, turning the field device on or off. Meanwhile, since the output current is lower than the estimated overflowing current, the voltage drop on the second resistor R2 is also lower than the estimated voltage drop. Therefore, the sampled voltage on the point between the second resistor R2 and the first transistor Q1 which is further guided to the positive input of the first voltage comparator U1 is still higher than the first reference voltage on the inverting input. As a result, the first voltage comparator U1 would also output a high resistance which may be considered as an off state on the output, such that the output of the first voltage comparator U1 would not impact the voltage on the base junction of the second transistor Q2, and thus would not impact the normal current output on the output terminal OUT.

Once a current larger than the predetermined estimated current passes through the output terminal due to the reduced resistance of an external load connected to the output terminal (this may occur when some fault such as partial short circuiting happens in the external load), the current passing through the output terminal is identified as an overflowing state. In this case, the voltage drop on the second resistor R2 would be higher than the estimated voltage drop. In this case, the voltage on the positive input of the first voltage comparator U1 would be lower than the first reference voltage on the inverting input of the first voltage comparator U1. As a result, the first voltage comparator U1 would output a low level. This would create a current path from the second voltage source S2 through the third resistor R3 to the output of the first voltage comparator U1. Since a current flows through the third resistor R3, the voltage on the base junction of the second transistor Q2 would drop to the same as on the output of the first voltage comparator U1, i.e. zero. Since the voltage on the base junction of the second transistor Q2 drops back to lower than the cut-off voltage of 0.7V, the second transistor Q2 would be switched off, such that the current path from the emitter junction of the first transistor Q1 to the base junction of the first transistor Q1 is cut off and the current flow from the base junction of the first transistor Q1 to the first resistor R1 would disappear. It looks like the control unit 3 sends a current regulating signal to the first transistor Q1 to switch off the first transistor Q1 for limiting the current passing through the first transistor Q1.

According to embodiments of the present disclosure, due to the existence of the first capacitor C1, the voltage on the base junction of the first transistor Q1 would not vary dramatically, and a relatively small current would be maintained from the emitter junction to the base junction of the first transistor Q1. As such, the first transistor Q1 would come into an amplifying zone, and the output current passing through the emitter junction and the collector junction of the first transistor Q1 to the output terminal OUT would reduce to the value of the relatively small current on the base junction multiplying the amplifying factor of the first transistor Q1. Because the first capacitor C1 discharges gradually, the voltage on the base junction of the first transistor Q1 would raise gradually and thus the small current on the base junction and in turn the output current passing through the emitter junction and the collector junction of the first transistor Q1 to the output terminal OUT would reduce gradually. Once the output current passing through the second resistor R2 reduces to a value which causes the sampling voltage on the emitter junction of the first transistor Q1 higher than the first reference voltage Vref1, the first voltage comparator U1 would again output a high resistance such that the second transistor Q2 would be conductive again. In this case, also due to the first capacitor C1, the current passing through the base junction of the first transistor Q1 would gradually increase which results in the output current on the output terminal OUT increasing. Once the output current on the output terminal OUT increases beyond a predetermined value corresponding to a voltage on the emitter junction of the first transistor Q1 equaling to the first reference voltage Vref1, the first voltage comparator U1 would output a low level again to switch off the second transistor Q2, which would cause the current on the base junction and the current on the output terminal to reduce again. As a result, due to the feedback of the first voltage comparator U1, the output current on the output terminal OUT would be limited within a safe value corresponding to the current value under which the first reference voltage is predetermined, i.e. the estimated current value as mentioned before. As such the limit to the overflowing on the output terminal OUT is realized.

Figure 2:
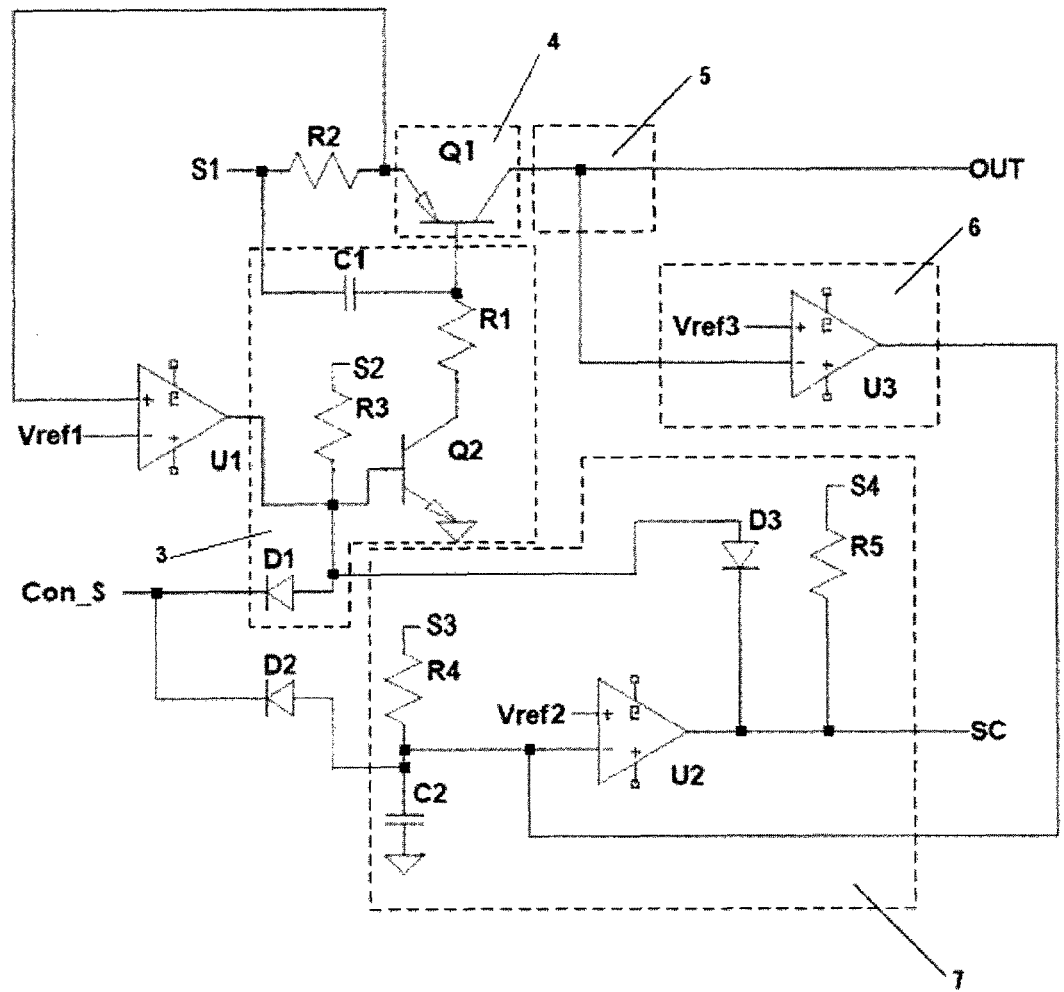
FIG. 2 illustrates a circuit diagram of the protective circuit according to another exemplary embodiment of the present disclosure.

FIG. 2 illustrates a circuit diagram of the digital output module with a protective circuit according to another embodiment of the present disclosure In addition to what has been described above, the protective circuit according to FIG. 2 can further comprise a second sampling unit 5 configured to sample a second voltage relevant to the output current from a first voltage source S1; a second comparing unit 6 configured to compare the sampled second voltage with a third reference voltage Vref3, and a signal processing unit 7 configured to process an output signal from the second comparing unit 6 to generate a short-circuit control signal. The control unit 3 can be further configured to generate a current regulating signal based on the short-circuit control signal. Upon receiving this current regulating signal, the current regulating unit 4 can cut off the output current to cut off the short-circuiting.

Specifically, according to an exemplary embodiment, the second comparing unit 6 can comprise a third voltage comparator U3. A positive input of the third voltage comparator U3 is connected to the third reference voltage Vref3, and an inverting input of the third voltage comparator U3 is connected to the output terminal of the protective circuit. An output of the third voltage comparator U3 is connected to the signal processing unit 7.

According to an exemplary embodiment, the signal processing unit 7 can comprise a second voltage comparator U2. A positive input of the second voltage comparator U2 is connected to a second reference voltage Vref2, and an inverting input of the second voltage comparator U2 is connected to the control signal terminal Con_S via a second diode D2. An output of the second voltage comparator U2 is connected to the base junction of the second transistor Q2 via a third diode D3. A third voltage source S3 is connected to the inverting input of the second voltage comparator U2 via a fourth resistor R4.

The second diode D2 only allows the current flowing from the third voltage source S3 to the control signal terminal Con_S, and the third diode D3 only allows the current flowing from the second voltage source S2 to the output of the second voltage comparator U2. The third voltage source S3 and the fourth voltage source S4 both act as a high level source, which are usually set to 5V, for example.

The second voltage comparator U2 can be configured to output low level if the voltage on its inverting input is higher than the second reference voltage Vref2, and output a relatively high resistance substantially corresponding to an off state if the voltage on its inverting input is lower than the second reference voltage Vref2. The third voltage comparator U3 is configured to output low level if the voltage on its inverting input is higher than the third reference voltage Vref3, and output a high resistance substantially corresponding to an off state if the voltage on its inverting input is lower than the third reference voltage Vref3. The second reference voltage Vref2 can be set to be lower than the voltage on the third voltage source S3, for example 2.5V. The third reference voltage Vref3 can be set to the value of the voltage of the first voltage source S1 minus the estimated voltage drop between the first voltage source S1 and the output terminal of the protective circuit in the short circuit state of the output terminal of the protective circuit. In this way, the short circuit can be defined as the current flowing through the output terminal OUT is so large to cause the voltage drop between the first voltage source S1 and the output terminal OUT exceeding the estimated voltage drop related to the third reference voltage. However, the current value in the short circuit condition should be defined larger than the current value in the overflowing condition. For example, in case the first voltage source S1 is 24V, the estimated voltage drop in the short circuit state can be set to 4V, such that the third reference voltage Vref3 would be 20V.

Preferably, a second capacitor C2 can be connected between the inverting input of the second voltage comparator U2 and ground to filter the noise being not an actual short circuit. Further preferably, a fourth voltage source S4 can be connected to the output of the second voltage comparator U2 via a fifth resistor R5, and the output of the second voltage comparator U2 may be connected to an external device for providing a signal informing the short circuit occurrence in the output terminal of the protective circuit.

In the condition without a short circuit on the output terminal OUT, either normal condition or overflowing condition, the current on the output terminal OUT is relatively low such that the voltage drop between the first voltage source S1 and the output terminal OUT is lower than the estimated voltage drop in the short circuit state. As a result, the voltage on the inverting input of the third voltage comparator U3 is higher than the third reference voltage on the positive input of the third voltage comparator U3, and thus the third voltage comparator U3 outputs a low level to the inverting input of the second voltage comparator U2. In this case, the voltage of the third voltage source S3 totally drops on the fourth resistor R4, and the voltage on the inverting input of the second voltage comparator U2 is lower than the second reference voltage on the positive input of the second voltage comparator U2, such that the second voltage comparator U2 outputs a high resistance corresponding to an off state. As a result, there is not current flowing from the second voltage source S2 to the third resistor R3, and thus the voltage on the base junction of the second transistor Q2 remains on the high voltage the same as the second voltage source S2. As such, the protective circuit operates normally or under overflowing condition with a current output from the output terminal OUT. In this case, since the second voltage comparator U2 outputs a high resistance, the fourth voltage source S4 may send a high level to a device via the terminal SC to indicate the no short circuit condition. The connected device can be an indicator for showing the circuit state to the user by transforming the received voltage level into visual or acoustical signal. Alternatively, the terminal SC can also be connected to other automatic devices such that the output voltage level corresponding to the circuit state can trigger some actions of the connected automatic devices.

Once a current exceeding the estimated current in the short circuit state as mentioned above occurs in the output terminal OUT, the current regulating unit 4 would firstly regulate the current within a predetermined range as described above. Due to the quite low resistance on the load in short circuit state, the sampled voltage on the output terminal OUT of the protection circuit, which is guided to the inverting input of the third voltage comparator U3, would reduce to be lower than the third reference voltage on the positive input. It means a short circuit has occurred in the load connected to the output terminal OUT. As a result, the third voltage comparator U3 outputs a high resistance substantially corresponding to an off state such that the current passing through the third voltage source S3 and the fourth resistor R4 to the output of the third voltage comparator U3 is cut off. In addition, since the control signal terminal Con_S outputs a high level while the digital output module is outputting a high level, the second diode D2 would not conduct a current from the third voltage source S3 through the fourth resistor R4 to the control signal terminal Con_S. As a result, there would be only a small current from the third voltage source S3 through the fourth resistor R4 to the second capacitor C2 for a short time to charge the second capacitor C2, and thus the voltage on the inverting input of the second voltage comparator U2 would gradually raise to approaching the voltage of the third voltage source S3. Once the charge to the second capacitor C2 has been finished, the voltage on the inverting input of the second voltage comparator U2 would raise to be equal to the voltage of the third voltage source S3 which is higher than the second reference voltage on the positive input of the second voltage comparator U2. Therefore, the second voltage comparator U2 would output a low level. As a result, a current would flow through the second voltage source S2, the third resistor R3 and the third diode D3 to the output of the second voltage comparator U2, and thus the voltage on the base junction of the second transistor Q2 would reduce to nearly zero, such that the second transistor Q2 is switched off, and the first transistor Q1 is in turn switched off, and there is no current passing through the output terminal OUT to the external load any more. As such, the output is cut off, such that the large current on the load is eliminated so as to protect the load. In addition, the large power output from the first transistor Q1 is also limited within a quite short period so as to protect the first transistor Q1. Therefore, the short circuit protection is realized. In this case, since the level on the output of the second voltage comparator U2 is zero, the voltage of the fourth voltage source S4 totally drops on the fifth resistor R5, such that there would be a low level output from the SC terminal. As such, a device connected to the SC terminal is informed that a short circuit occurs.

Since the second capacitor C2 delays the voltage rising on the inverting input of the second voltage comparator U2, a noise such as an instant large current on the output terminal OUT due to the other reasons other than actual short circuit would not trigger the cut off action of the protective circuit immediately. If the noise disappears in a very short time, the circuit would not be impacted and it still output a current continuously. As such, an un-intended cut off can be avoided. It is appreciated that by determining the capacitance of the second capacitor C2 and the second reference voltage Vref2 properly, the delayed period can be adjusted such that it would not last too long to increase the risk of the transistor damage under large current. Preferably, the delayed duration is set to the value in the order of millisecond to prevent the first transistor Q1 from operating in the overloaded state for a long time.

Once the first transistor Q1 has been switched off due to short circuiting, since the inverting input of the second voltage comparator U2 keeps in high voltage, the output of the second voltage comparator U2 would keep outputting low level. As a result, the current flow from the second voltage source S2 through the third resistor R3 to the output terminal of the second voltage comparator U2 is maintained, such that the voltage on the base junction of the second transistor Q2 keeps in low level and the second transistor Q2 keeps being switched off, which in turn result in the first transistor Q1 in the switched off state. Therefore, the digital output module is locked in the switched off state without any current output.

If the short circuit fault has been eliminated and the user wants to switch the circuit on again to output a current to the load, he/she can firstly set the control signal on the control signal terminal Con_S as low level, such that the second capacitor C2 can discharge through the second diode D2 so as to restore the voltage on the inverting input of the second voltage comparator U2 to a low level. In this case, the second voltage comparator U2 can output a quite high resistance such that the voltage on the base junction of the second transistor Q2 is restored to a high level which causes the second transistor Q2 and the first transistor Q1 to be conductive, such that the circuit can output a current from the output terminal OUT again.

It is appreciated that the first transistor Q1 can be implemented as a P-channel metal oxide semiconductor, and the second transistor Q2 can be implemented as a N-channel metal oxide semiconductor. In this case, the base junction is identified as gate, the emitter junction is identified as source, and the collector junction is identified as drain.

The protective circuit can be connected to each channel of the digital output module, such that each channel can obtain an individual overflowing and short circuit protection. In addition, since all the electronic elements in the protective circuit are common elements which are relatively cheap, the cost for each protective circuit is rather cheaper compared to the smart high side switch as known. Thus, it is acceptable in cost to provide one protective circuit for each channel of the digital output module. It is particularly advantageous for the digital output module with large number of channels because it would not significantly increase the cost for the module. Furthermore, this protective circuit can also provide indication of short circuit and filter the instant large current as a noise. Therefore, the protective circuit is more reliable. It is appreciated that the protective circuit can also be used in any other kinds of electric and electronic devices, without losing the advantageous effects as mentioned before.

By studying the drawings, the disclosure of the embodiments of the present disclosure, and the attached Claims, those skilled in the art may understand and implement other modifications of the disclosed embodiments during the implementation of the present disclosure. In the claims, "comprising" does not exclude other elements or steps, and "a" or "one" does not exclude the plural concept. The simple fact of illustrating specific elements in the dependent claims, which are mutually different from each other, does not indicate that the combination of these elements cannot be used advantageously. The labels in drawings of the claims should not be interpreted as limiting the scopes thereof.

Though the present disclosure has been described with reference to the currently considered embodiments, it should be appreciated that the present disclosure is not limited to the disclosed embodiments. On the contrary, the present disclosure is intended to cover various modifications and equivalent arrangements falling within in the spirit and scope of the appended claims. The scope of the appended claims is accorded with broadest explanations and covers all such modifications and equivalent structures and functions.

What is claimed is:

1. A protective circuit to be used in a digital output module, the digital output module comprising a first voltage source and at least an output terminal,
wherein the protective circuit comprising:
a first sampling unit configured to sample a first voltage relevant to an output current from the first voltage source;
a first comparing unit configured to compare the sampled first voltage with a first reference voltage;
a current regulating unit comprising a first transistor having a base junction configured to regulate the output current from the first voltage source based on a current regulating signal; and
a control unit configured to generate the current regulating signal based on a result from the first comparing unit, the control unit comprising a second transistor and a first capacitor, the second transistor having a base junction connected to a second voltage source via a first resistor unit and connected to a control signal terminal of the digital output module via a first diode, the first capacitor being connected between the base junction of the first transistor and the first voltage source,
wherein the first comparing unit comprises a connection between the first sampling unit and the current regulating unit.

2. The protective circuit according to claim 1,
wherein the first transistor is configured to be conductive under a low level on the base junction which is lower than a cut-off voltage, and
wherein a collector junction of the first transistor is configured to be connected to one of the at least an output terminal, the base junction of the first transistor is connected to the control unit, and an emitter junction of the first transistor is connected to the sampling unit.

3. The protective circuit according to claim 2,
wherein the first comparing unit comprises a first voltage comparator,
wherein an inverting input of the first voltage comparator is connected to a first reference voltage, and a positive input of the first voltage comparator is connected between the sampling unit and the emitter junction of the first transistor, and an output of the first voltage comparator is connected to the control unit.

4. The protective circuit according to claim 3,
wherein the first voltage comparator is configured to output low level if the voltage on its positive input is lower than the first reference voltage, and output a high resistance substantially corresponding to an off state if the voltage on its positive input is higher than the first reference voltage.

5. The protective circuit according to claim 3, wherein the first reference voltage is set to the value of the voltage of the first voltage source minus the estimated voltage drop on the sampling unit in the overflowing state of the output terminal.

6. The protective circuit according to claim 1, wherein the sampling unit comprises a third resistor unit.

7. The protective circuit according to claim 1, wherein the second transistor includes an emitter junction and a collector junctions; wherein the second transistor is configured to be conductive under a high level on the base junction which is higher than a cut-off voltage; and wherein the collector junction of the second transistor is connected to the base junction of the first transistor via a third resistor unit, the base junction of the second transistor is connected to an output of the first comparing unit, and the emitter junction of the second transistor is connected to the grounding plane.

8. The protective circuit according to claim 7, wherein the signal processing unit comprises a second voltage comparator, wherein a positive input of the second voltage comparator is connected to a second reference voltage, and an inverting input of the second voltage comparator is connected to the control signal terminal via a second diode, and an output of the second voltage comparator is connected to a base junction of the second transistor via a third diode.

9. The protective circuit according to claim 8, wherein the signal processing unit further comprising a third voltage source connected to the inverting input of the second voltage comparator via a fourth resistor unit.

10. The protective circuit according to claim 8, wherein the second voltage comparator is configured to output low level if the voltage on its inverting input is higher than the second reference voltage, and output a relatively high resistance substantially corresponding to an off state if the voltage on its inverting input is lower than the second reference voltage.

11. The protective circuit according to claim 10, wherein the second reference voltage is set to be lower than the voltage on the third voltage source.

12. The protective circuit according to claim 8, wherein the signal processing unit further comprising a second capacitor connected between the inverting input of the second voltage comparator and the grounding plane.

13. The protective circuit according to claim 8, wherein the signal processing unit further comprising a fourth voltage source connected to the output of the second voltage comparator via a fifth resistor unit.

14. The protective circuit according to claim 1, further comprising:
a second sampling unit configured to sample a second voltage relevant to the output current from the first voltage source;
a second comparing unit configured to compare the sampled second voltage with a third reference voltage; and
a signal processing unit configured to process an output signal from the second comparing unit to generate a short-circuit control signal; and
wherein the control unit is further configured to generate the current regulating signal based on the short-circuit control signal.

15. The protective circuit according to claim 14,
wherein the second comparing unit comprises a third voltage comparator,
wherein a positive input of the third voltage comparator is connected to the third reference voltage, and an inverting input of the third voltage comparator is connected to the output terminal, and an output of the third voltage comparator is connected to the signal processing unit.

16. The protective circuit according to claim 15,
wherein the third voltage comparator is configured to output low level if the voltage on its inverting input is higher than the third reference voltage, and output a high resistance substantially corresponding to an off state if the voltage on its inverting input is lower than the third reference voltage.

17. The protective circuit according to claim 16,
wherein the third reference voltage is set to the value of the voltage of the first voltage source minus the estimated voltage drop between the first voltage source and the output terminal in the short circuit state of the output terminal.

18. A combination comprising:
a digital output module having at least one output channel connected to a protective circuit;
wherein the protective circuit comprises:
a first sampling unit configured to sample a first voltage relevant to an output current sampling from a first voltage source to a load;
a first comparing unit configured to compare the sampled first voltage with a first reference voltage;
a control unit configured to generate a current regulating signal and a voltage source control signal based on a result from the first comparing unit, the control unit comprising a transistor having a base junction;
a current regulating unit configured to selectively interrupt the output current from the first voltage source to the load based on the current regulating signal,
a voltage source control terminal configured to be coupled to the first voltage source and control the voltage source control signal output from the control unit to the current regulating unit; and
wherein the voltage source control terminal is configured to be coupled to the base junction of the transistor and a second voltage source by way of a diode, and coupled to a third voltage source, and to selectively interrupt the current regulating signal based on a signal from the digital output module.

19. A protective circuit to be used in a digital output module, the digital output module comprising a first voltage source and at least an output terminal,
wherein the protective circuit comprising:
a first sampling unit configured to sample a first voltage relevant to a output current from the first voltage source;
a first comparing unit configured to compare the sampled first voltage with a first reference voltage;
a control unit configured to generate a current regulating signal based on a result from the first comparing unit; and
a current regulating unit configured to regulate the output current from the first voltage source based on the current regulating signal,
wherein the current regulating unit comprises a first transistor having a base junction, an emitter junction and a collector junction, the first transistor is configured to be conductive under a low level on the base junction which is lower than a cut-off voltage
wherein the control unit comprises a second transistor having a base junction connected to a second voltage source via a first resistor, an emitter junction and a collector junction, wherein the second transistor is configured to be conductive under a high level on the base junction which is higher than a cut-off voltage;
wherein the collector junction of the second transistor is connected to the base junction of the first transistor via a first resistor unit, the base junction of the second transistor is connected to an output of the first comparing unit, and the emitter junction of the second transistor is connected to a grounding plane; and
wherein the control unit comprises a first capacitor connected between the base junction of the first transistor and the first voltage source.

* * * * *